United States Patent
Gruber et al.

(10) Patent No.: US 6,231,333 B1
(45) Date of Patent: May 15, 2001

(54) APPARATUS AND METHOD FOR VACUUM INJECTION MOLDING

(75) Inventors: Peter Alfred Gruber, Mohegan Lake; Egon Max Kummer, Croton-on-Hudson, both of NY (US); Bernie Hernandez, Norwalk, CT (US); Thomas George Ference, Essex Junction, VT (US); Arthur Richard Zingher, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 751 days.

(21) Appl. No.: 08/518,874

(22) Filed: Aug. 24, 1995

(51) Int. Cl.[7] .................................................. B29C 35/00
(52) U.S. Cl. .......................... 425/546; 425/13; 425/127; 425/129.1; 425/812; 118/256; 118/410; 427/96; 427/97
(58) Field of Search .................................... 118/356, 410, 118/412, 421, 50; 425/129.1, 127, 546, 812, 11, 12, 13; 427/96, 97, 295, 296, 297; 220/256, 250

(56) References Cited

U.S. PATENT DOCUMENTS

| | | | |
|---|---|---|---|
| 3,470,848 | * 10/1969 | Dreher | 118/50 |
| 3,735,729 | * 5/1973 | Bird | 118/50 |
| 3,749,053 | * 7/1973 | Timson | 118/50 |
| 3,797,281 | * 3/1974 | Norton | 68/19.1 |
| 3,996,885 | * 12/1976 | Jackson et al. | 118/50 |
| 4,140,470 | * 2/1979 | Pasch et al. | 425/546 |
| 4,146,081 | * 3/1979 | Reis | 425/546 |
| 4,572,103 | * 2/1986 | Engel | 118/410 |
| 4,934,309 | * 6/1990 | Ledermann et al. | 118/410 |
| 4,959,246 | * 9/1990 | Cleempat | 427/97 |
| 4,961,955 | * 10/1990 | Goldberg | 118/410 |
| 4,968,534 | * 11/1990 | Bogardy | 118/410 |
| 4,982,777 | 1/1991 | Chandley | 164/63 |
| 5,059,112 | * 10/1991 | Wieser | 425/546 |
| 5,238,176 | * 8/1993 | Nishimura | 118/410 |
| 5,244,143 | 9/1993 | Ference et al. | 228/180.21 |
| 5,303,762 | 4/1994 | Chandley | 164/63 |

OTHER PUBLICATIONS

Middleman, S. "Fundamentals of Polymer Processing" p. 260–261, 1997.*

* cited by examiner

Primary Examiner—Harold Pyon
(74) Attorney, Agent, or Firm—Francis L. Conte

(57) ABSTRACT

An apparatus and method utilize vacuum injected molding of a liquid in a plurality of mold cells for solidification therein. An injection head includes spaced apart vacuum and injection slots positionable atop a mold plate in flow communication with the mold cells therein. Relative axial sliding is effected between the injection head and the mold plate for sequentially evacuating gas from the mold cells using a continuous vacuum followed in turn by sequentially injecting into the evacuated mold cells the liquid from a continuous source thereof. Sliding of the injection head over the mold plate automatically provides self valving for sequentially evacuating and filling the mold cells from the same side of the mold plate. In a preferred embodiment, the vacuum and injection slots are linked together at the mold plate so that surface tension of the liquid restrains flow of the liquid from the injection slot to the vacuum slot while allowing gas flow therebetween for effecting the vacuum in the mold cells.

20 Claims, 2 Drawing Sheets

APPARATUS AND METHOD FOR VACUUM INJECTION MOLDING

CROSS-REFERENCE TO RELATED APPLICATION

This application is related to commonly assigned and concurrently filed application Ser. No. 08/518,736, filed Aug. 24, 1995, entitled "Solder Anchor Decal and Method" now U.S. Pat. No. 5,673,846.

BACKGROUND OF THE INVENTION

The present invention relates generally to injection molding, and, more specifically, to vacuum initiated injection molding of solder or plastic for example.

Standard injection molding uses positive pressure to force a liquid with low viscosity into mold cavities. The injected liquid displaces the gas or air in the mold cavities and is then allowed to solidify for forming the desired molded article. If the mold cavity is large, or if the cavity is open at two places, then displaced gas can easily flow out a vent. However, a tiny cavity with a single opening, or blind hole, presents special difficulties. For solder molding when the cavity diameter is quite small, such as 10–750 microns, then it is very difficult or impractical to include a vent. This is especially true in a array of mold cavities with cavity separation as small as about 75 microns. Such blind hole mold cavities will trap gas therein preventing complete filling of the cavity with the injected liquid resulting in defective molded articles. And, since the injection pressure exceeds ambient or atmospheric pressure, undesirable leakage of the injected liquid in the injection apparatus may occur.

Vacuum casting and vacuum-initiated blow-molding solve some of these problems. However, these methods typically require sophisticated valves and are limited as to mold sizes and types. The molds are typically injected one at a time in a sequential process which seals the liquid reservoir to each mold cavity in turn. After a temporary seal is made, valves sequentially introduce vacuum and liquid into the mold cavity.

SUMMARY OF THE INVENTION

An apparatus and method utilize vacuum injected molding of a liquid in a plurality of mold cells for solidification therein. An injection head includes spaced apart vacuum and injection slots positionable atop a mold plate in flow communication with the mold cells therein. Relative axial sliding is effected between the injection head and the mold plate for sequentially evacuating gas from the mold cells using a continuous vacuum followed in turn by sequentially injecting into the evacuated mold cells the liquid from a continuous source thereof. Sliding of the injection head over the mold plate automatically provides self valving for sequentially evacuating and filling the mold cells from the same side of the mold plate. In a preferred embodiment, the vacuum and injection slots are linked together at the mold plate so that surface tension of the liquid restrains flow of the liquid from the injection slots to the vacuum slot while allowing gas flow therebetween for effecting the vacuum in the mold cells.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DESCRIPTION OF THE PREFERRED EMBODIMENT(S)

Figure 1:
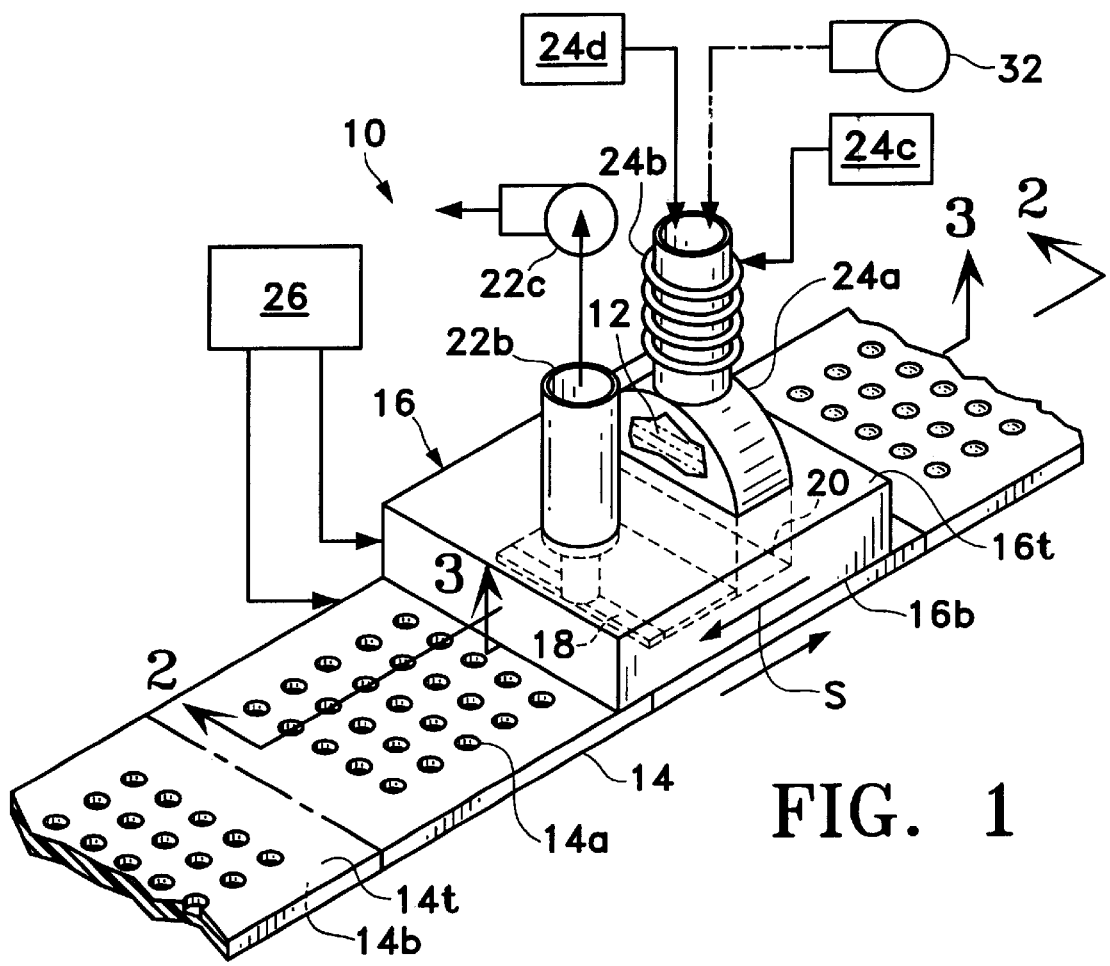
FIG. 1 is a schematic representation of an apparatus for vacuum injection molding a liquid into a mold plate in accordance with one embodiment of the present invention.
Figure 2:
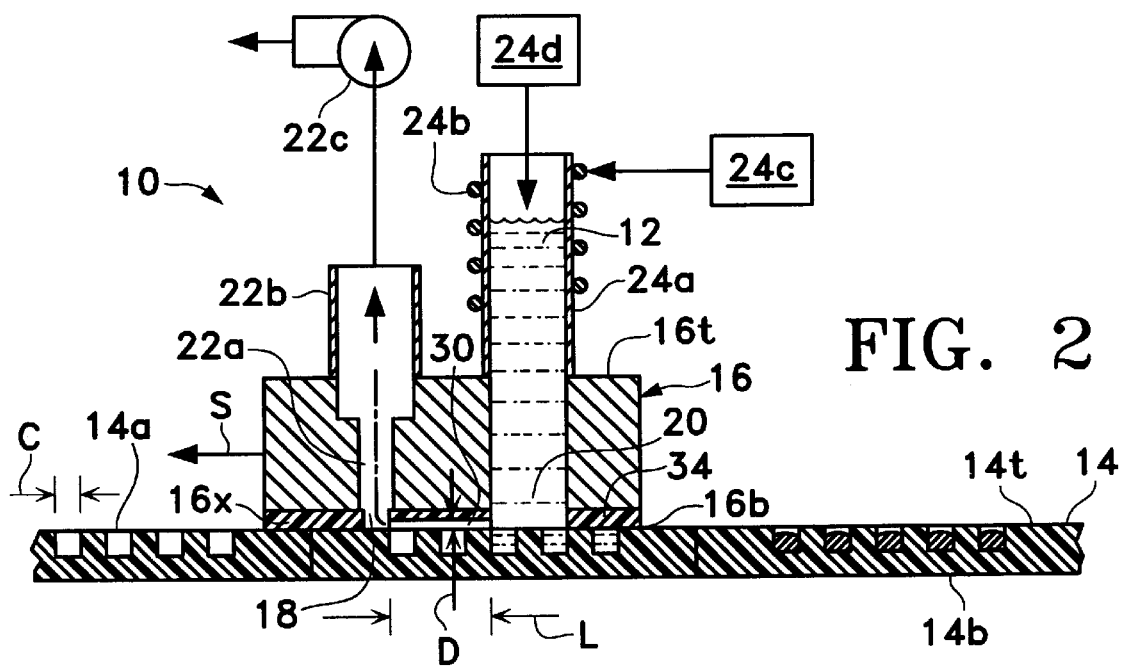
FIG. 2 is a sectional, side elevational view of the apparatus illustrated in FIG. 1 and taken generally along line 2—2 for vacuum injection molding a mold plate having blind holes.

Illustrated schematically in FIGS. 1 and 2 is an assembly or apparatus 10 for injection molding a suitable molding liquid 12 into a plurality of mold cells 14a contained in a mold plate 14 for solidification therein. The molding liquid 12 may take any conventional form including solder or plastic for example, and in the exemplary embodiment illustrated the liquid 12 is solder. The mold plate 14 may take any conventional form and in the exemplary embodiment it may be a suitable substrate, interposer, or semi-conductor chip for the electronics industry which requires the formation of solder balls or beads therein typically arranged in a rectangular grid array as illustrated. In the exemplary embodiment illustrated in FIGS. 1 and 2, a plurality of adjoining mold plates 14 are illustrated in the form of a continuous tape having pluralities of the mold cell grid arrays spaced axially apart therein for undergoing a continuous injection molding process.

The injection apparatus 10 includes an injection head 16 in the form of a preferably flat plate. The injection head 16 has top and bottom surfaces 16t and 16b, and the mold plate 14 has top and bottom surfaces 14t and 14b. In operation, the bottom surface 16b of the injection head 16 is positioned atop the top surface 14t of the mold plate 14 for injection molding the liquid 12 from only the top surface 14t thereof.

Figure 3:
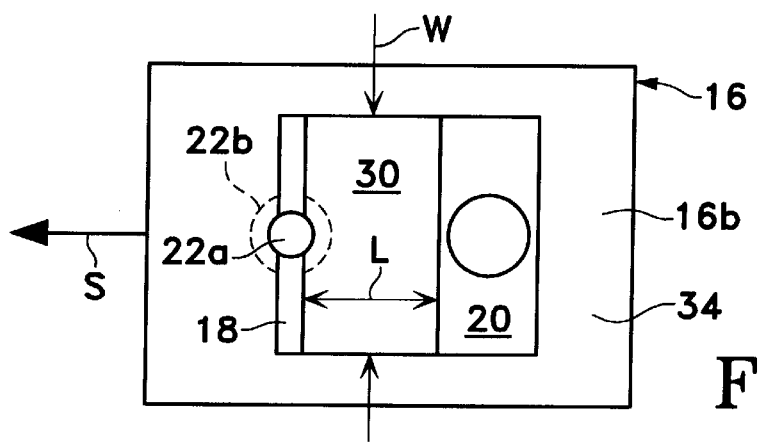
FIG. 3 is a bottom plan view of the injection head illustrated in FIG. 1 and taken generally along line 3—3.

As illustrated in FIGS. 2 and 3, the injection head 16 includes at its bottom surface 16b a vacuum port or slot 18 and an injection port or slot 20 spaced axially therefrom. As shown in FIGS. 1 and 2, suitable conventional means are provided for continuously evacuating gas from the vacuum slot 18 so that a vacuum may be effected in the mold cells 14a sequentially in turn and row-by-row of adjacent mold cells 14a in accordance with the invention. In the exemplary embodiment illustrated in FIGS. 1 and 2, the vacuum is effected by providing a tubular vacuum port 22a vertically through the injection head 16 in flow communication with the vacuum slot 18, with the port 22a being joined by a suitable conduit 22b to a conventional vacuum pump 22c.

Suitable means are also provided for supplying the liquid 12 into the injection slot 20 to fill the mold cells 14a evacuated by the vacuum slot 18. In the exemplary embodiment illustrated in FIGS. 1 and 2, a liquid reservoir 24a extends upwardly through the injection head 16 in flow communication with the injection slot 20 for storing the liquid 12 therein. Since the liquid 12 in this exemplary embodiment is molten solder, the reservoir 24a is surrounded at least in part by a conventional heating element or coil 24b electrically powered by a suitable power supply 24c.

In the preferred embodiment illustrated in FIGS. 1 and 2, the liquid solder reservoir 24a is preferably open at its top to atmospheric pressure for continuously receiving a wire or ribbon of solid solder from a suitably powered supply reel 24d for continuously replenishing the solder liquid 12 in the reservoir 24a.

In accordance with the present invention, the injection head 16 may be simply scanned along the top surface 14t of the mold plate 14 for effecting vacuum injection molding of the individual mold cells 14a in preferably full rows thereof sequentially in turn in a self-valving operation without the need for additional or external valves to control evacuation of the mold cells 14a and injection of the liquid 12 therein. More specifically, and as shown in FIG. 1, suitable transporting means 26 are provided for joining together in sealed abutting contact and effecting relative axial sliding between the injection head 16 and the mold plate 14 for sequentially joining in flow communication each of the mold cells 14a first with the vacuum slot 18 and second with the injection slot 20 in turn to automatically evacuate and fill the mold cells 14a row-by-row.

Since simple relative axial sliding movement between the injection head 16 and the mold plate 14 is required, either the injection head 16 may be caused to move relative to a stationary mold plate 14, or the mold plate 14 may be caused to move relative to a stationary injection head 16, or both the mold plate 14 and the injection head 16 may be separately moved relative to each other. The axial scanning direction is indicated by the arrow labeled S to show relative axial movement along the longitudinal axis of the mold plate 14 relative to the injection head 16. The axial transport means 26 may take any suitable or conventional form including for example driving the injection head 16 by a conventional rack and pinion; or by a conventional lead screw; or by a suitable conveyor belt. Or, one or more of the mold plates 14 may be translated axially relative to the injection head 16 by being carried on a suitable conveyor belt for example; or the mold plates 14 may be integrally formed in a continuous belt, tape, or ribbon and carried longitudinally by suitably powered supply and take-up reels for another example.

Referring again to FIG. 2, sliding or scanning of the injection head 16 relative to the mold plate 14 in the scanning direction S effects sequential evacuation of gas from the mold cells 14a in turn row-by-row using a continuous and unvalved constant vacuum on the top surface 14t of the mold plate 14 within the area covered by the vacuum slot 18. As the mold cells 14a are evacuated, they continuously move aft or rearwardly toward the injection slot 20 for sequential injection into the evacuated mold cells 14a in turn of the liquid 12 from the continuous and unvalved reservoir 24a of the liquid 12 within the area covered by the injection slot 20.

In the preferred embodiment illustrated in FIGS. 1 and 2, the bottom surface 16b of the injection head 16 and the top surface 14t of the mold plate 14 are complementary in configuration and are preferably both flat and smooth so that the injection head 16 may be positioned in abutting contact with the mold plate 14 for effecting a simple pneumatic abutting seal therebetween.

The bottom surface 16b sealingly engages the mold plate 14 around the vacuum and injection slots 18, 20, with vacuum in the vacuum slot 18 being effective for clamping together the injection head 16 and mold plate 14 and withdrawing any gas leakage therebetween for maintaining vacuum in the mold cells 14a prior to filling with the liquid 12. In this way, the vacuum effected in the vacuum slot 18 is used for self-sealing the injection head 16 to the mold plate 14 which inherently prevents leakage of the liquid 12 from between the injection head 16 and the mold plate 14.

A suitable amount of compression force may also be introduced by a spring or powered piston to initially join together the injection head 16 and the mold plate 14 while still allowing relative axial sliding movement therebetween. The vacuum created in the vacuum slot 18 provides additional force for maintaining together the injection head 16 with the mold plate 14 and will evacuate any gas leaking into the joint defined between the injection head 16 and the mold plate 14.

Since the liquid 12 in the exemplary embodiment is solder, the molding process is preferably carried out in an inert gas such as nitrogen under ambient atmospheric pressure for reducing oxidation of the molded solder. Also in the preferred embodiment, the reservoir 24a is open at its top and is maintained under at least atmospheric pressure. The reservoir 24a extends upwardly through the injection head 16 from the injection slot 20, with the reservoir 24a containing a pool of the liquid 12 for gravity and vacuum-drawn flow downwardly to automatically feed the injection slot 20 to fill the evacuated mold cells 14a. In this configuration, the vacuum effected in the mold cells 14a is the primary driving or drawing force for filling the individual cells 14a with the liquid 12 from the injection slot 20, and in turn from the reservoir 24a. The pressure head of the liquid 12 in the injection slot 20 may also be used to assist in filling the mold cells 14a to the extent that pressure is greater than the effect of surface tension within the injection slot 20 tending to restrain draining therefrom.

Figure 4:
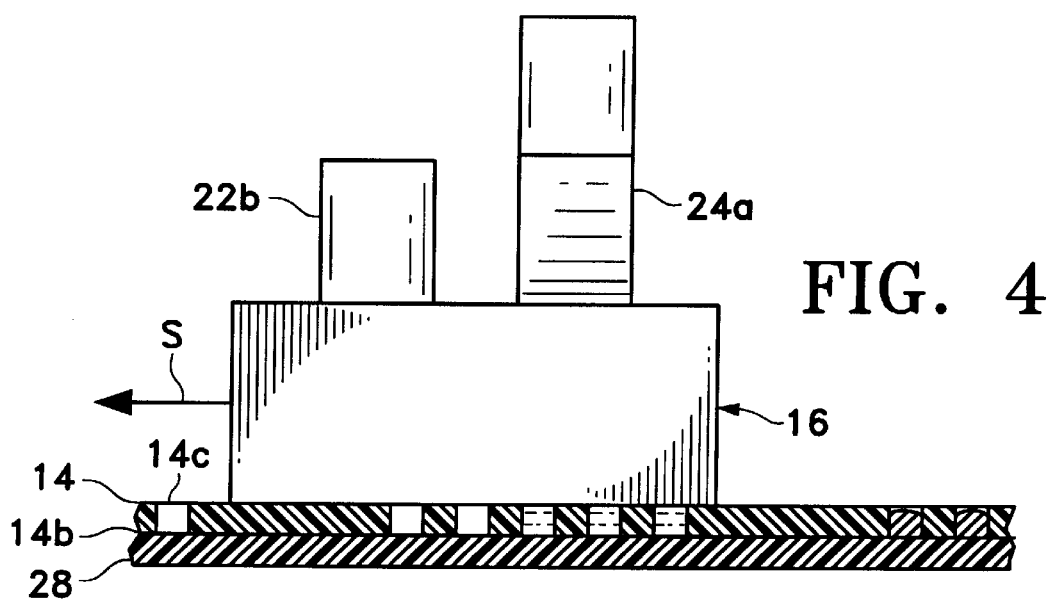
FIG. 4 is a side elevational view of the injection head illustrated in FIG. 1 used for vacuum injection molding a mold plate having through holes closed at one end by a vacuum plate.

In this way, the mold plate 14 may be evacuated and filled from only one, or the top, side thereof in a simple self-valving arrangement. The mold cells 14a are preferably open only at the top surface 14t of the mold plate 14, and closed at the bottom surface 14b thereof. In the exemplary embodiment illustrated in FIGS. 1 and 2, the mold cells 14a are in the form of blind cavities extending only partly inwardly into the top of the mold plate 14. In FIG. 4, the mold cells, designated 14c, in the mold plate 14 are in the form of through-holes, with a suitable non-wetting backing plate 28 being disposed in abutting contact with the bottom surface 14b of the mold plate 14 for closing the bottom ends of the mold cells 14c for allowing evacuation and filling of the cells from only the tops thereof.

Since the individual mold cells 14a illustrated in FIG. 2, for example, are axially spaced apart from each other in the mold plate 14, vacuum may be diminished in the short spacing between the vacuum slot 18 and the injection slot 20 as the slots are scanned in turn from cell-to-cell. In accordance with another feature of the present invention, means are provided for linking the vacuum slot 18 to the injection slot 20 at the bottom surface 16b of the injection head 16 between the injection head 16 and the mold plate 14 for continuing or maintaining vacuum in each mold cell 14a even during filling of the mold cell 14a with the liquid 12 from the injection slot 20. However, the linking means must also be effective for preventing or restraining leakage of the liquid 12 into the vacuum slot 18 which could degrade or prevent formation of the required vacuum in the vacuum slot 18.

In the exemplary embodiment illustrated in FIGS. 2 and 3, the linking means is in the form of a shallow slot or recess 30 formed in the bottom surface 16b of the injection head 16 and extending axially between the vacuum slot 18 and the injection slot 20 in flow communication therewith. The linking recess 30 has a shallow depth D sized so that the surface tension of the liquid 12 restrains flow of the liquid from the injection slot 20 to the vacuum slot 18 while allowing gas flow therebetween through the linking recess 30 for continuing or maintaining the vacuum initiated from the vacuum slot 18 in the mold cells 14a in turn to allow the liquid to fill completely the mold cells 14a. Unless the mold cells 14a are suitably evacuated, the liquid 12 may not completely fill the mold cells 14a which is especially significant for small sized mold cells 14a. By suitably linking the evacuating and injecting steps effected by the vacuum and injection slots 18, 20 at each of the mold cells 14a, surface tension may be advantageously used in accordance with the present invention for automatically preventing, without separate valving, the evacuation of the liquid 12 injected into the mold cells 14a while allowing evacuation of only the gas therefrom.

The vacuum and any other joining force press the injection head 16 against the mold plate 14 to help seal together these components at least along their planar margins or perimeters. The vacuum slot 18 initially evacuates gas from each row of the mold cells 14a. This is followed in turn by the linking recess 30 which allows the gas to continue to be evacuated by the vacuum slot 18 continuously up to the injection of the liquid 12 into the mold cells 14a. Any gas which seeps or leaks in between the injector head 16 and the mold plate 14 during operation is removed through the linking recess 30 by the vacuum slot 18. As the injection slot 20 slides over each evacuated row of the mold cells 14a, the liquid 12 is sucked or drawn by vacuum into the mold cells 14a which have been evacuated by the vacuum slot 18 and the linking recess 30.

Although the linking recess 30 allows continuation of evacuation of the mold cells 14a up to the moment of liquid injection into the cells 14a, the injected liquid 12 must be prevented from flowing through the linking recess 30 and contaminating or blocking the vacuum slot 18 and the source of vacuum itself. By suitably sizing the linking recess 30 with a sufficiently shallow depth D, surface tension may be effectively used for preventing the liquid 12 from flowing through the linking recess 30, while allowing unobstructed gas flow. In the preferred embodiment, the materials of the components of the injection head 16 and the mold plate 14 which are in contact with the liquid 12 are preferably chosen to be non-wetting therewith for preventing adhesion thereto in both the liquid and solidified states thereof. The linking recess 30 itself is also made of a suitable non-wetting material.

However, surface tension of the liquid 12 at the linking recess 30 nevertheless occurs, with the linking recess 30 being suitably sized in accordance with the present invention to take advantage of the surface tension to prevent the flow of the liquid 12 through the linking recess 30 notwithstanding the vacuum being effected by the vacuum slot 18. Surface tension causes a cylindrical meniscus of the liquid 12 at the juncture of the linking recess 30 and the injection slot 20. The meniscus pressure associated therewith is directly proportional to the surface tension of the liquid 12 and inversely proportional to the depth D of the linking recess 30, with a factor due to the cylindrical shape of the meniscus being experimentally determined for example. The difference between the vacuum pressure in the vacuum slot 18 and the ambient pressure at the top of the reservoir 24a effects a differential pressure across the linking recess 30.

The meniscus pressure and the differential pressure act in opposite directions, with the linking recess being sized sufficiently shallow so that the meniscus pressure exceeds the differential pressure so that the liquid 12 cannot enter the linking recess 30. However, a gas such as air or nitrogen does not exhibit a surface tension nor a meniscus, and therefore can flow freely through the shallow linking recess 30.

In an exemplary embodiment, the liquid 12 is a molten eutectic solder (Sn/Pb) having a melting point of about 183° C. which is suitably heated to about 200° C. to form the pool in the reservoir 24a. The depth D of the linking recess 30 preferably has a magnitude less than that at which the meniscus pressure is equal to the differential pressure, or less than about 10 microns. In one embodiment, the depth D may be within the range of about 2–5 microns for effecting a meniscus pressure of about 2 atmospheres, with the differential pressure caused by the vacuum in the vacuum slot 18 being about 0.9 atmospheres.

As illustrated in FIGS. 1 and 2, the mold cells 14a are arranged in a rectangular grid array, and the linking recess 30 illustrated in FIG. 3 has a transverse width W preferably greater than a corresponding width of the grid array so that sequential individual rows of the grid array mold cells 14a are concurrently joined in flow communication with the vacuum slot 18 and the injection slot 20 in turn. The depth D of the linking recess 30 is the controlling factor for providing sufficient surface tension of the liquid 12 for preventing vacuum loss of the liquid 12 through the linking recess 30. The transverse width W of the linking recess 30 may have any suitable value for covering one or more of the mold cells 14a, and preferably all of the cells in individual rows.

The length L of the linking recess 30 in the axial or scanning direction is selected to ensure that an individual mold cell 14a does not span both the vacuum slot 18 and the injection slot 20 simultaneously which would allow the liquid 12 to leak into the vacuum slot 18 and degrade its performance. In the exemplary embodiment illustrated in FIGS. 1 and 2, the mold cells 14a are identical to each other and have a maximum diameter C as shown in FIG. 2, with the axial length L of the linking recess 30 being greater than the cell maximum diameter C for preventing each of the mold cells 14a from simultaneously spanning both the vacuum and injection slots 18, 20. In the exemplary embodiment illustrated in FIG. 2, the length L is on the order of three times the diameter C of the cells 14a for example.

Accordingly, the injection head 16 as illustrated in FIG. 2 may be scanned across the mold plate 14 during operation in sliding abutting contact therewith, with the vacuum slot 18 firstly evacuating sequential rows of the mold cells 14a, followed in turn by the injection slot 20 injecting sequentially the liquid 12 therein. The linking recess 30 effects a flow channel extending in flow communication between the vacuum and injection slots 18, 20, and between the injection head 16 and the mold plate 14, for maintaining vacuum in the cells 14a automatically without separate or dedicated valves to sequentially fill the mold cells 14a without vacuum loss of the liquid 12 through the linking recess 30.

The apparatus 10 and method have been successfully employed to fill molds for solder preforms ranging from large to small with mold cells 14a having diameter-by-height of 500×1750 microns and 12×25 microns, respectively. Both through-hole and blind-hole mold cells have been successfully injected with molten solder to completely fill the cells without gas induced voids.

The optimum scan speed and differential pressure in the injection process depend on the volume, aspect ratio (height/diameter) and array pitch of the mold cells. Exemplary scan speeds utilized were in the range of about 0.7–5.0 mm/second. The scanning speed may be adjusted for completely eliminating any trapped gas or air and avoiding incompletely filled mold cells. In general, as larger volume mold cells are used, more time is required to evacuate the gas or air, with an attendant decrease in scan speed. Furthermore, differential gas pressure must overcome viscous drag as the gas is sucked through the shallow linking recess 30. Ambient pressure at the liquid reservoir 24a should be sufficient for many applications. However, smaller mold cells 14a favor a positive pressure at the reservoir 24a only slightly greater than ambient pressure, e.g. about 1 psi greater for example. Accordingly, FIG. 1 illustrates schematically the use of an optional conventional pump 32 suitably joined in flow communication to the liquid reservoir 24a for effecting the slight pressurization therein if desired for injection molding small or micro-cells of a few microns in diameter. The pump 32 is effective for pressurizing the liquid reservoir 24a for increasing differential pressure across the mold cells 14a.

In order to minimize viscous drag of the liquid 12 as it travels from the liquid reservoir 24a into the injection slot 20, the reservoir 24a preferably transitions from a tubular top portion to a diverging fan-shaped bottom portion, as shown in FIG. 1, to maximize the cross section thereof at the juncture with the injection slot 20.

The vacuum slot 18 as illustrated in FIG. 3 is coextensive in width with both the linking recess 30 and the injection slot 20 so that the mold cells 14a may be evacuated and filled row-by-row in turn. Vacuum from the vacuum slot 18 will initiate injection of the liquid 12 from the reservoir 24a to automatically draw more liquid 12, or molten solder, into the injection slot 20. The corresponding length of the vacuum and injection slots 18, 20 may be suitably selected for adequately covering mold cell rows for effectively evacuating and injecting the cells 14a in turn. The depth of the vacuum slot 18 may have any suitable value. In the exemplary embodiment illustrated in FIG. 2, the vacuum slot 18 has a depth and length in the exemplary range of about 50–150 microns, and a width in the exemplary range of about 1–3 cm. The vacuum slot 18 is preferably made as small as practical in length and depth for ensuring an adequate vacuum supply while minimizing the slot volume in the event of any liquid leakage. The injection slot 20 preferably has a length of about one to three times the diameter of the mold cells 14a, and a width equal to that of the linking recess 30.

As shown in FIGS. 2 and 3, the bottom surface 16b of the injection head 16 defines a wiper 34 extending between a trailing edge of the injection slot 20 and a trailing edge of the injector head 16, with the wiper 34 being positionable in abutting contact with the top surface 14t of the mold plate 14 for wiping the mold plate 14 around the mold cells 14a upon the relative sliding movement between the injection head 16 and the mold plate 14 for removing the liquid therefrom. As the injection head 16 scans over the mold plate 14 the rows of mold cells 14a are filled with the liquid 12, with the wiper 34 removing excess liquid and returning it to the injection slot 20 as the wiper 34 axially traverses the filled rows of mold cells 14a.

The wiper 34 is sized relatively short in axial length so that the liquid 12 begins to solidify only after the wiper 34 scans or slides past and uncovers the mold cells 14a filled with the liquid from the injection slot 20. As shown in FIG. 2, the mold cells 14a at the left of the injection head 16 are empty except for the environmental gas such as nitrogen or air contained therein. As the injection head 16 slides to the left in FIG. 2 and covers rows of the mold cells 14a the gas is evacuated from the cells, with the cells in turn being filled with the liquid 12. As the injection head 16 continues its movement to the left in FIG. 2, the wiper 34 passes over the filled cells which are then uncovered for allowing solidification of the injected liquid in the mold cells 14a as shown by the right-most cells in FIG. 2 having metallic cross hatching thereof. The solidified liquid 12 may have slightly rounded top surfaces due to surface tension thereof. Where the liquid 12 is molten solder, solidification thereof may occur by allowing the molten solder to simply cool below its freezing temperature preferably without obstruction or confinement by the injection head 16, and for example by using a using a suitable heat sink (not shown) under the mold plate 14.

As indicated above, and as shown in FIGS. 1 and 2 for example, both the injection head 16 and the mold plate 14 are preferably flat and smooth where they abut for forming a suitable pneumatic seal promoted by the vacuum slot 18. However, any unevenness between the two components due to manufacturing tolerances can allow slight leakage of the ambient atmosphere, such as nitrogen, between the components which will increase the vacuum requirements of the vacuum pump 22c. In order to reduce any leakage between the injection head 16 and the mold plate 14, the bottom surface 16b of injection head 16 and the top surface 14t of the mold plate 14 are preferably formed of different materials, with one being more compliant than the other for accommodating any unevenness therebetween caused by manufacturing tolerances, for example, for ensuring effective sealed abutting contact therebetween when they are pressed together. In one embodiment as illustrated in FIG. 2, the injection head bottom surface 16b is more compliant than the mold plate 14, although in an alternate embodiment the opposite may be effected.

The injection head 16 and its related components, and the mold plate 14 may comprise any suitable materials for the specific liquid 12 being utilized so that they are non-wetting relative thereto for preventing the liquid 12 from undesirably adhering thereto during operation. For example, in the exemplary embodiment illustrated in FIG. 2 wherein the liquid 12 is molten solder, the injection head 16 is formed of a non-wetting metal and may include an integral bottom layer 16x of a suitable high temperature polymer such as polyimide like Kapton (TM) tape. The mold plate 14 may be in the exemplary form of a silicon substrate, interposer, or semiconductor chip typically used in the electronics industry. The linking recess 30, as well as the vacuum and injection slots 18, 20 may be conventionally etched into the layer 16x thus ensuring that the molten solder liquid 12 is non-wetting relative to the linking recess 30 and the injection slot 20. The layer 16x may also be a surface coating of titanium nitride, for example, having acceptable material properties for practicing the method.

The injection head 16 could alternatively be formed of a single material such as glass or quartz with the vacuum and injection slots 18, 20 and the linking recess 30 being conventionally formed therein by etching. The mold plate 14 may take any suitable form such as silicon, glass, or a suitable metal, or a polymer such as Kapton (TM) tape which would allow for a continuous process by suitably transporting the tape in supply and take-up reels, with the mold cells 14a formed thereon being scanned in turn row-by-row past the injection head 16 for filling the cells with the liquid 12, which is then solidified therein in completing the process.

Figure 5:
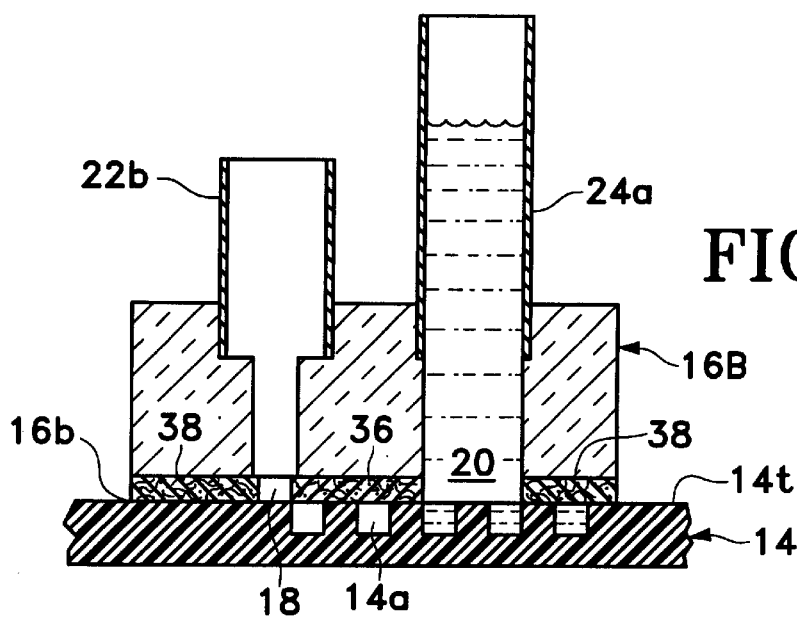
FIG. 5 is an alternate embodiment of the vacuum injection head illustrated in FIG. 1 illustrating an open cell foam pad linking together the vacuum and injection slots atop the mold plate.

FIGS. 2 and 3 illustrated one embodiment of linking the vacuum and injection slots 18, 20 which effectively uses surface tension for continuing the evacuation process until the mold cells are filled with the liquid 12, while preventing the liquid 12 from escaping into the vacuum slot 18. FIG. 5 illustrates an alternate embodiment of an injection head designated 16B which is generally similar to the injection head 16 disclosed above except for the different type of linking means. In this embodiment, the injection head 16B is formed of anodized metal, or a suitable quartz or glass material, e.g. Pyrex (TM) glass, and the linking means between the vacuum and injection slot 18, 20 comprises a conventional open-cell porous foam pad 36 defining in part a portion of the bottom surface 16b of the injection head 16B between the vacuum and injection slots 18, 20. The linking pad 36 itself abuts the top surface 14t of the mold plate 14 and is disposed in flow communication between the vacuum slot 18 and the injection slot 20. The open-cells of the linking pad 36 are preferably sized for collectively defining a flow channel between the vacuum and injection slots 18, 20 so that surface tension of the liquid 12 prevents liquid flow therethrough while allowing gas flow therethrough for effecting the vacuum in the mold cells 14a in a manner similar to that described for the linking recess 30 described above. In this embodiment, the overall depth of the linking pad 36 itself is not significant, but the porosity, or cell size, of the linking pads 36 controls the surface tension. In an exemplary embodiment, the porosity of the linking pad 36 should be less than about 5 microns for allowing gas escape with suitable surface tension of the liquid 12 for preventing liquid escape through the linking pad 36.

In the exemplary embodiment illustrated in FIG. 5, the bottom surface 16b of the injection head 16B comprises the open-cell foam pad 36 axially between the vacuum and injection slots 18, 20, with the remainder of the bottom surface 16b being defined by a conventional closed-cell foam pad 38 for providing suitable compliance thereof relative to the mold plate 14. Although the open-cell pad 36 is illustrated axially between the vacuum slot 18 and the injection slot 20, the vacuum slot 18 could instead communicate with the pad 36 from directly above and not separately terminate at the head bottom surface 16b. In either embodiment, vacuum is still effected through the pad 36, with the remainder of the bottom surface 16b being formed of the closed cell pad 38. Both the open-cell and closed-cell foam pads 36, 38 may be formed of a suitable high temperature polymer when the liquid 12 is molten solder, with the linking pad 36 maintaining vacuum in the mold cells 14a until they are filled with the liquid 12, and the closed-cell pads 38 providing compliance for ensuring an effective abutting seal between the adjoining injection head 16B and the mold plate 14 during the scanning process.

The apparatus and method for vacuum injection molding described above is relatively simple and has the potential for dramatically lowering production costs for injection molding into mold plates 14. The injection head 16 simply operates on only one side of the mold plate 14 and does not require independent or separate valves which would increase the complexity thereof. Self-valving is accomplished by merely scanning the injection head 16 axially along the mold plate 14 to sequentially evacuate and fill the mold cells 14a row-by-row. The abutting contact between the injection head 16 and mold plate 14 and the relative axial movement therebetween inherently provides valving to separately, and in turn, evacuate the mold cells 14a and then fill them with the liquid 12. The linking recess 30 or pad 36 ensures the continuation of the evacuation process even as the mold cells 14a are being filled with the liquid 12, without loss of the liquid 12 through the linking channels themselves. The invention makes practical the solder injection molding of extremely small mold cells having diameters within the range of about 10 microns to about 750 microns without concern for sufficiently evacuating the cells prior to solder injection. The small cells may be arranged in a grid array having correspondingly small separation between individual cells down to about 75 microns for example. The vacuum slot 18 and linking components effectively evacuate the gas from the mold cells for allowing substantially complete filling thereof with liquid solder for ensuring a high productivity rate of manufacture while significantly reducing defects and costs of manufacture.

Although the invention has been described for the specific example of injection molding molten solder in a mold plate for the electronics industry, the invention is applicable as well to injection molding of other liquids such as plastics. Any molten liquid having a suitably low viscosity and large surface tension may be utilized in a common one-piece injection head. The linking recess 30, or linking pad 36, or other analogous structure, may be specifically sized so that surface tension prevents vacuum loss of the liquid therethrough while allowing continuation of the evacuating step even as the injection step is filling the same mold cell with the liquid.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims:

What is claimed is:

1. An apparatus for injection molding a liquid into a plurality of cells in a plate for solidification therein comprising:

an injection head having a bottom surface including a vacuum slot and an injection slot spaced axially therefrom;

means for joining together in abutting contact and effecting relative axial sliding movement between said injection head and said plate for sequentially joining in flow communication each of said cells with said vacuum slot and said injection slot in turn;

means for evacuating gas from said vacuum slot for effecting a vacuum in said cells in turn during said relative axial sliding between said injection head and said mold plate;

means for supplying said liquid into said injection slot to fill said evacuated cells in turn; and means for linking in flow communication said vacuum slot and said injection slot so that surface tension of said liquid prevents evacuation of said liquid injected into said cells while allowing evacuation only of said gas therefrom.

2. An apparatus according to claim 1 wherein said injection head includes non-wetting surfaces for contacting said liquid to prevent adhesion thereto.

3. An apparatus according to claim 1 wherein said injection head bottom surface is substantially flat to sealingly engage said plate around said vacuum and injection slots, with vacuum in said vacuum slot being effective for clamping together in part said injection head and plate and withdrawing any gas leakage therebetween for maintaining vacuum in said cells prior to filling with said liquid.

4. An apparatus according to claim 3 wherein said liquid supplying means comprises a reservoir extending upwardly through said injection head from said injection slot, and containing a pool of said liquid for gravity flow downwardly to feed said injection slot under at least atmospheric pressure to fill said evacuated cells.

5. An apparatus according to claim 4 further comprising means for pressurizing said reservoir for increasing differential pressure across said cells.

6. An apparatus according to claim 4 wherein said reservoir transitions from a tubular top portion to a diverging fan-shaped bottom portion joining said injection slot.

7. An apparatus according to claim 4 wherein said linking means comprises an open-cell porous foam pad defining in part a portion of said injection head bottom surface, and disposed in flow communication between said vacuum slot and said injection slot, said foam cells being sized so that surface tension of said liquid prevents liquid flow therethrough while allowing gas flow therethrough for effecting said vacuum in said cells.

8. An apparatus according to claim 7 wherein said injection head bottom surface comprises said open-cell foam pad axially between said vacuum slot and said injection slot, with a remainder thereof being a closed-cell foam pad for providing compliancy thereof relative to said plate.

9. An apparatus according to claim 4 wherein said injection head bottom surface defines a wiper extending between a trailing edge of said injection slot and a trailing edge of said injection head, said wiper being positionable in abutting contact with said plate for wiping said plate around said cells upon said relative sliding between said injection head and plate for wiping said liquid therefrom.

10. An apparatus according to claim 9 wherein said wiper is sized so that said liquid begins to solidify only after said wiper slides past and uncovers cells filled with said liquid from said injection slot.

11. An apparatus according to claim 9 wherein said injection head bottom surface and said plate are formed of different materials with one being more compliant than the other for accommodating any unevenness therebetween for ensuring sealed abutting contact therebetween.

12. An apparatus according to claim 11 wherein said injection head bottom surface is more compliant than said plate.

13. An apparatus according to claim 4 wherein said linking means comprises a recess in said injection head bottom surface extending axially between said vacuum slot and said injection slot in flow communication therewith, said linking recess having a shallow depth sized so that surface tension of said liquid prevents liquid flow therethrough while allowing gas flow therethrough for effecting said vacuum in said cells.

14. An apparatus according to claim 13 wherein said vacuum slot is coextensive in width with both said linking recess and said injection slot.

15. An apparatus according to claim 13 wherein said cells have a maximum diameter, and said linking recess has an axial length greater than said cell maximum diameter for preventing each of said cells from spanning both said vacuum slot and said injection slot.

16. An apparatus according to claim 15 wherein said cells are arranged in a rectangular grid array, and said linking recess has a transverse width greater than a corresponding width of said grid array so that sequential individual rows of said grid array cells are concurrently joined in flow communication with said vacuum slot and said injection slot in turn.

17. An apparatus according to claim 16 wherein said liquid is molten solder, and said linking recess depth is within a range of about 2–5 microns.

18. A method for injection molding a liquid into a plurality of cells in a plate for solidification therein comprising:
    evacuating sequentially gas from said cells using a continuous vacuum on said plate;
    injecting sequentially into said cells said liquid from a continuous source of said liquid;
    linking said evacuating and injecting steps at each of said cells so that surface tension of said liquid prevents evacuation of said liquid injected into said cells while allowing evacuation of only said gas therefrom; and
    solidifying said injected liquid in said cells.

19. A method according to claim 18 further comprising scanning an injection head across said plate in sliding abutting contact therewith, with said injection head having:
    a vacuum slot for effecting said evacuating step;
    an injection slot for effecting said injecting step; and
    a flow channel extending in flow communication between said vacuum slot and said injection slot for effecting said linking step automatically without any valve to sequentially fill said cells without vacuum loss of said liquid.

20. An apparatus for injection molding a liquid into a plurality of cells in a plate for solidification therein comprising:
    means for evacuating sequentially gas from said cells using a continuous vacuum on said plate;
    means for injecting sequentially into said cells said liquid from a continuous source of said liquid; and
    means for linking said evacuating and injecting means at each of said cells so that surface tension of said liquid prevents evacuation of said liquid injected into said cells while allowing evacuation of only said gas therefrom;
    whereby said injected liquid solidifies in said cells.

* * * * *